US012699816B2

(12) United States Patent
Li et al.

(10) Patent No.: US 12,699,816 B2
(45) **Date of Patent: *Aug. 4, 2026**

(54) METHOD AND APPARATUS FOR CONTEXT SENSING INFERENCE

(71) Applicant: Nokia Technologies Oy, Espoo (FI)

(72) Inventors: Xueying Li, Anhui (CN); Huanhuan Cao, Beijing (CN); Jilei Tian, Beijing (CN)

(73) Assignee: Nokia Technologies Oy, Espoo (FI)

( * ) Notice: Subject to any disclaimer, the term of this patent is extended or adjusted under 35 U.S.C. 154(b) by 1640 days.

This patent is subject to a terminal disclaimer.

(21) Appl. No.: 17/078,528

(22) Filed: Oct. 23, 2020

(65) Prior Publication Data

US 2021/0141971 A1      May 13, 2021

Related U.S. Application Data

(63) Continuation of application No. 14/353,601, filed as application No. PCT/CN2011/081694 on Nov. 2, 2011, now Pat. No. 10,853,531.

(51) Int. Cl.
H04M 1/72454        (2021.01)
G06F 16/9535        (2019.01)
(Continued)

(52) U.S. Cl.
CPC .......... G06F 30/20 (2020.01); G06F 16/9535 (2019.01); H04L 67/30 (2013.01); (Continued)

(58) Field of Classification Search
CPC ..... G06F 30/20; G06F 16/9535; H04L 67/30; H04L 67/34; H04W 4/029; H04M 1/72454; H04M 2250/12
See application file for complete search history.

(56) References Cited

U.S. PATENT DOCUMENTS 6,842,906 B1 *  1/2005  Bowman-Amuah  ... G06F 9/465
                                                  719/330
2009/0036102 A1 *  2/2009  Ho ........................ H04L 67/306
                                                  455/412.2
2010/0331146 A1 *  12/2010  Kil ......................... G06Q 30/02
                                                  482/8

OTHER PUBLICATIONS

Park et al. CAS2: Context Awareness Service System Based on Wireless Sensor Networks ICACT Feb. 2006 (Year: 2006).*

(Continued)

*Primary Examiner* — Rehana Perveen
*Assistant Examiner* — Cuong V Luu
(74) *Attorney, Agent, or Firm* — Duft & Bornsen, PC

(57)        ABSTRACT

The exemplary embodiments of the invention provide at least a method, apparatus and system to perform operations including receiving context data from an electronic device, causing, at least in part based on the received context data, an identification of at least one context model compatible with the electronic device, and causing, at least in part, provision of the electronic device with the at least one compatible context model. In addition, the exemplary embodiments of the invention further provide at least a method, apparatus and system to perform operations including causing, at least in part, a provision of context data associated with an electronic device to a context inference service, in response, receiving a context model from the context inference service, and causing adaptation of the received context model as a current context model of the electronic device.

15 Claims, 6 Drawing Sheets

610: receive a request with an initial context model (i.e. insufficient or outdated context model) from another/new user device for an initial context inference model 620: identify the one or more context models which can be used by/for the another/new user device due to full or partial similarities between the one more context models and the initial context model 630: combine and/or infer the one or more identified context models for the another/new user device as the initial context inference model 640: download/share with the another/new user device the initial context inference model 660: prompt/instruct the another/new user device to adapt the downloaded/shared initial context inference model and/or converge to an optimized context inference model for the another/new user device while the device is being used

(51) Int. Cl.
| | |
|---|---|
| *G06F 30/20* | (2020.01) |
| *H04L 67/30* | (2022.01) |
| *H04W 4/029* | (2018.01) |
| *H04L 67/00* | (2022.01) |

(52) U.S. Cl.
CPC ............. *H04W 4/029* (2018.02); *H04L 67/34* (2013.01); *H04M 1/72454* (2021.01); *H04M 2250/12* (2013.01)

(56) References Cited

OTHER PUBLICATIONS

Philipp Gutheim An Ontology-Based Context Inference Service for Mobile Applications in Next-Generation Networks IEEE Communication Magazine, Jan. 2011 (Year: 2011).*

* cited by examiner $t_i$ means $s$ is inferred in the stable status and $t_i$ means $s$ is inferred in the unstable status 410: receiving context data from an electronic device

420: causing, at least in part based on the received context data, identification of at least one context model compatible with the electronic device

430: causing, at least in part, provision of the electronic device with the at least one compatible context model

FIGURE 4

510: causing, at least in part, a provision of context data associated with an electronic device to a context inference service

520: in response, receiving a context model from the context inference service

530: causing adaptation of the received context model as a current context model of the electronic device

FIGURE 5

610: receive a request with an initial context model (i.e. insufficient or outdated context model) from another/new user device for an initial context inference model

620: identify the one or more context models which can be used by/for the another/new user device due to full or partial similarities between the one more context models and the initial context model

630: combine and/or infer the one or more identified context models for the another/new user device as the initial context inference model

640: download/share with the another/new user device the initial context inference model

660: prompt/instruct the another/new user device to adapt the downloaded/shared initial context inference model and/or converge to an optimized context inference model for the another/new user device while the device is being used

METHOD AND APPARATUS FOR CONTEXT SENSING INFERENCE

CROSS-REFERENCE TO RELATED APPLICATIONS

This application is a continuation of U.S. patent application Ser. No. 14/353,601, filed Apr. 23, 2014, now issued as U.S. Pat. No. 10,853,351, which is a National Stage Entry of International Application No. PCT/CN2011/081694, filed Nov. 2, 2011, the disclosures of which are incorporated herein by reference in their entirety.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Context-aware technologies play a vital role in enabling context-aware application operations on devices, such as a mobile device, to provide intelligent, personalized, situation-aware applications and services to a user of a mobile device. Context sensing is obviously a fundamental process required for context-aware technologies. Context sensing includes sensing information from sensor or through user's interaction in broadly defined, regarding a location of the device and/or its surroundings. Such context information can be obtained using sensors and/or other applications implemented on the mobile device. With this information context based technologies and their applications can be enabled to provide adaptive services responsive to a user's current context. Such services can provide a class of user context specific services, including services related to wellness and health, recommendation, social media, finance and the information market, to name a few.

However, at least a problem exists in that conventional context sensing mechanism does not discriminate context data collected by the device. Thus, the device must work to process and store all the collected context data. As such there are related costs to the device, the costs associated with excessive memory utilization and computation, as well as additional energy required for conventional context-aware technology. Thus, context-sensing mechanism, and their applications, can be limited and, as such, can prevent a user from taking advantage of many benefits which the conventional context-aware technologies may provide.

Certain abbreviations that may be found in the description and/or in the Figures are herewith defined as follows:

| A-GPS | assisted GPS |
| DP | data processor |
| GPS | global positioning system |
| eNB | base station |
| MME | mobility management entity |
| REST | representational state transfer |
| UE | user equipment |
| WLAN | wireless local area network |

SUMMARY

In an exemplary aspect of the invention, there is a method comprising receiving context data from an electronic device, causing, at least in part based on the received context data, an identification of at least one context model compatible with the electronic device, and causing, at least in part, provision of the electronic device with the at least one compatible context model.

In another exemplary aspect of the invention there is an apparatus comprising at least one processor, and at least one memory including computer program code, where the at least one memory and the computer program code are configured, with the at least one processor, to cause the apparatus to at least receive context data from an electronic device, cause, at least in part based on the received context data, identification of at least one context model compatible with the electronic device, and cause, at least in part, provision of the electronic device with the at least one compatible context model.

In another exemplary aspect of the invention there is an apparatus comprising, a means for receiving context data from an electronic device, a means, for causing, at least in part based on the received context data, identification of at least one context model compatible with the electronic device, and a means for causing, at least in part, provision of the electronic device with the at least one compatible context model.

In another exemplary aspect of the invention there is a method comprising causing, at least in part, a provision of context data associated with an electronic device to a context inference service, in response, receiving a context model from the context inference service, and causing adaptation of the received context model as a current context model of the electronic device.

In another exemplary aspect of the invention there is an apparatus comprising at least one processor, and at least one memory including computer program code, where the at least one memory and the computer program code are configured, with the at least one processor, to cause the apparatus to at least cause, at least in part, a provision of context data associated with an electronic device to a context inference service. Then in response, receive a context model from the context inference service and cause, at least in part, adaptation of the received context model as a current context model of the electronic device.

In yet another exemplary aspect of the invention there is an apparatus comprising means for causing, at least in part, a provision of context data associated with an electronic device to a context inference service, means, in response to causing the provision, for receiving a context model from the context inference service, and means for causing, at least in part, adaptation of the received context model as a current context model of the electronic device.

In still another exemplary aspect of the invention there is a system comprising an electronic device causing, at least in part, a provision of context data associated with an electronic device to a context inference service, based, at least in part, on the provisioning at the context inference service, the context inference service causing an identification of at least one context model compatible with the electronic device, based at least in part on the identification, the context inference service causing, at least in part, provision at the electronic device with the at least one compatible context model, and the electronic device causing, based at least in part on the provisioning at the electronic device, an adaptation of the received context model as a current context model of the electronic device

BRIEF DESCRIPTION OF THE DRAWINGS

The foregoing and other aspects of embodiments of this invention are made more evident in the following Detailed Description, when read in conjunction with the attached Drawing Figures, wherein:

FIG. 4, FIG. 5 and FIG. 6 are block diagrams which each illustrate a method in accordance with the exemplary embodiments of the invention.

DETAILED DESCRIPTION

As was stated above, conventional context-aware technologies often apply on a device, such as a portable electronic device, to work continuously to obtain context data and/or manage obtained context data. The context data is used to build a current context of a portable electronic device such that the context-aware technologies on the device can function. In addition, all context data obtained, no matter how much redundancy it has, must be processed and stored by the device. Further, the operations required to use the conventional context-aware technologies can at least cause a substantial drain of battery power and excessive memory and CPU usage. As such, context-aware technologies may not be desirable to a user of the portable electronic device.

Figure 1A:
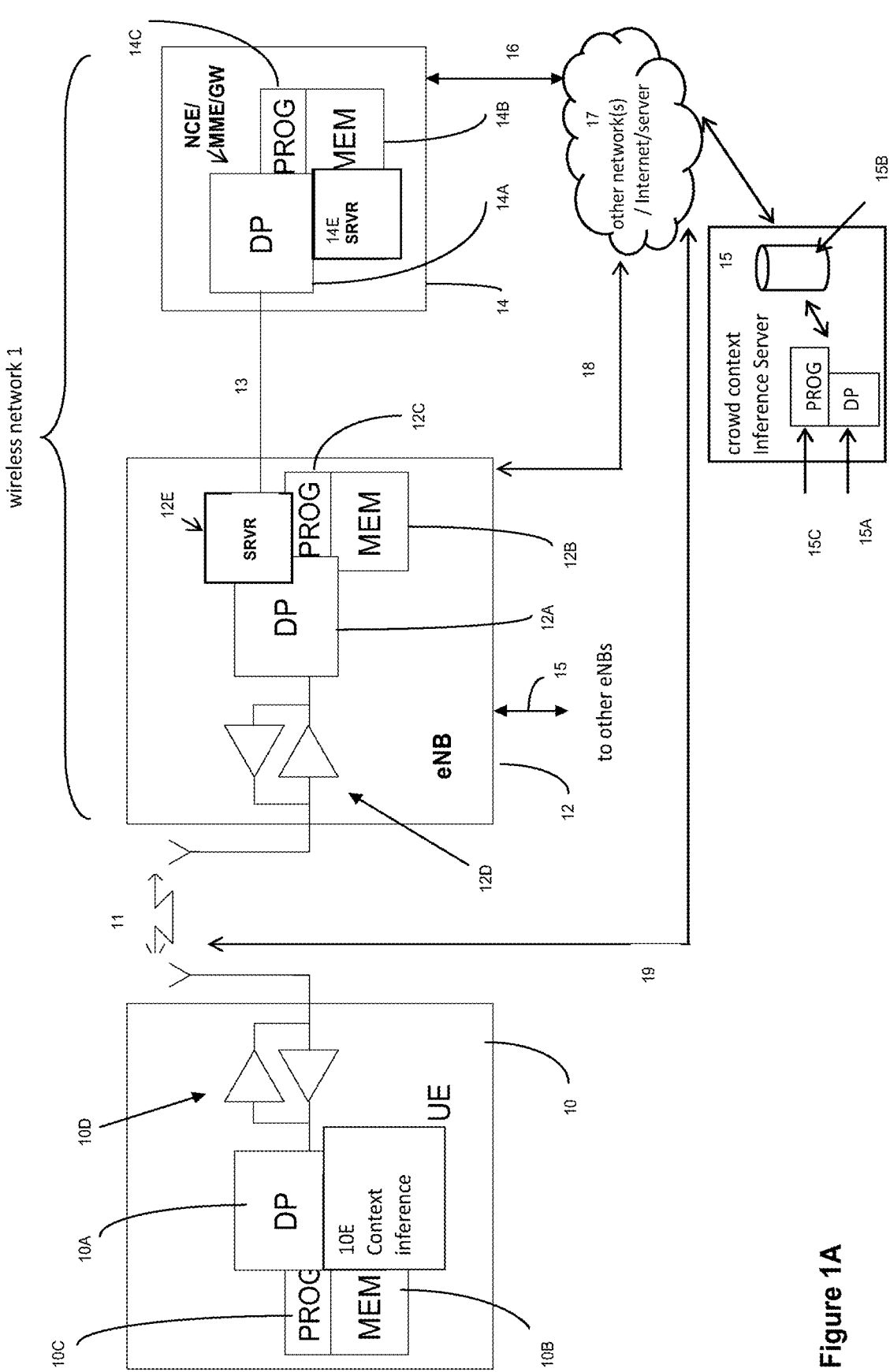
FIG. 1A illustrates a simplified block diagram of various electronic devices and apparatus that are suitable for use in practicing the exemplary embodiments of this invention.

The exemplary embodiments of the invention address at least the above described problems. For example, the exemplary embodiments of the invention provide for one or more crowd sourcing context models for one or more electronic devices. Further, the exemplary embodiments of the invention enable context models to be uploaded or otherwise provided to a server to be stored in a common repository by the server. Then the server can analyze and/or identify the one or more context models thought user similarity analysis and thus enable new user devices and/or existing user devices to communicate with the server so as to obtain current context models most optimum for the device Reference is now made to FIG. 1A for illustrating a simplified block diagram of various electronic devices and apparatus that are suitable for use in practicing the exemplary embodiments of this invention. In FIG. 1A a wireless network 1 is adapted for communication over a wireless link 11 with a portable apparatus, such as UE 10, via a network access node, such as a base station, in this case the eNB 12. The network 1 may include a network control element (NCE) 14 that may include functionality as a mobility management entity (MME) and serving gateway (GW), and which provides connectivity with a further network such as a telephone network and/or a data communications network (e.g., the internet). The UE 10 includes a controller, such as a computer or a data processor (DP) 10A, a computer-readable memory medium embodied as a memory (MEM) 10B that stores a program of computer instructions (PROG) 10C, and a suitable radio frequency (RF) transceiver 10D for bidirectional wireless communications with the eNB 12 via one or more antennas. The eNB 12 also includes a controller, such as a computer or a data processor (DP) 12A, a computer-readable memory medium embodied as a memory (MEM) 12B that stores a program of computer instructions (PROG) 12C, and a suitable RF transceiver 12D for communication with the UE 10 via one or more antennas. The eNB 12 is coupled via a data/control path 13 to the GW 14.

At least the PROG 10C includes program instructions or computer software that, when executed by the associated DP 10A, enable the device 10 to operate in accordance with the exemplary embodiments of this invention, as discussed above by non-limiting examples. That is, the exemplary embodiments of this invention may be implemented at least in part by computer software executable by the DP 10A of the UE 10, or by hardware, or by a combination of software and hardware (and firmware). In addition, a crowd context inference server 15 similarly includes at least one computer readable memory and/or database 15B embodying at least one computer program code 15C, and at least one data processor 15A configured to execute computer program code to perform operations in accordance with the exemplary embodiments of the invention. In addition, the database 15B can be external to the crowd context inference server 15. Further, operations, in accordance with the exemplary embodiments of the invention, of the crowd context inference server 15 may be performed by a server function (s) integrated into another network device. For example, the operations in accordance with the exemplary embodiments of the invention may be performed by the server function 12E incorporated into the eNB 12 and/or the server function 14E incorporated into the NCE/MME/GW 14.

In general, the various embodiments of the UE 10 can include, but are not limited to, any type of mobile terminal, fixed terminal, or portable terminal including a mobile handset, station, unit, device, multimedia computer, multimedia tablet, Internet node, communicator, mobile communication device, desktop computer, laptop computer, notebook computer, netbook computer, tablet computer, personal communication system (PCS) device, personal navigation device, personal digital assistants (PDAs), audio/video player, digital camera/camcorder, positioning device, television receiver, radio broadcast receiver, electronic book device, game device, or any combination thereof, including the accessories and peripherals of these devices, or any combination thereof. It is also contemplated that the UE 10 can support any type of interface to the user (such as "wearable" circuitry, etc.).

The computer readable MEMs 10B, 12B, 14B and 15B may be of any type suitable to the local technical environment and may be implemented using any suitable data storage technology, such as semiconductor based memory devices, flash memory, magnetic memory devices and systems, optical memory devices and systems, fixed memory and removable memory. The DPs 10A, 12A, 14A and 15A may be of any type suitable to the local technical environment, and may include one or more of general purpose computers, special purpose computers, microprocessors, digital signal processors (DSPs) and processors based on multicore processor architecture, as non-limiting examples.

Figure 1B:
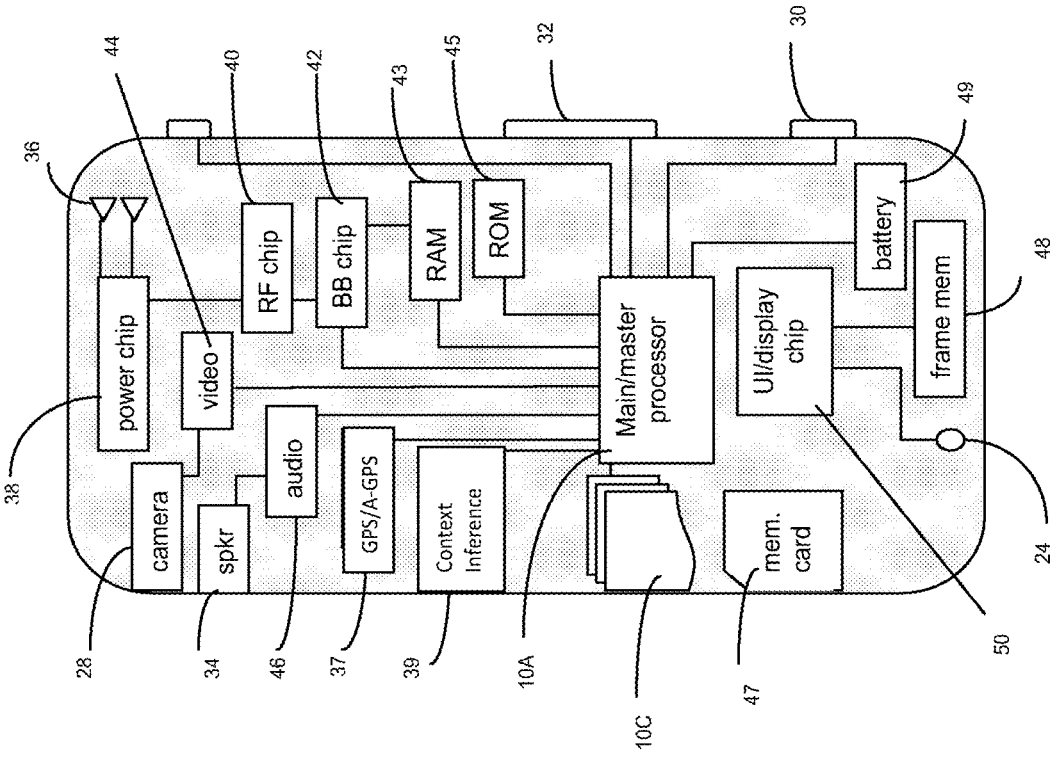
FIG. 1B illustrates details of an electronic device suitable to perform the exemplary embodiments of the invention.
Figure 1B:
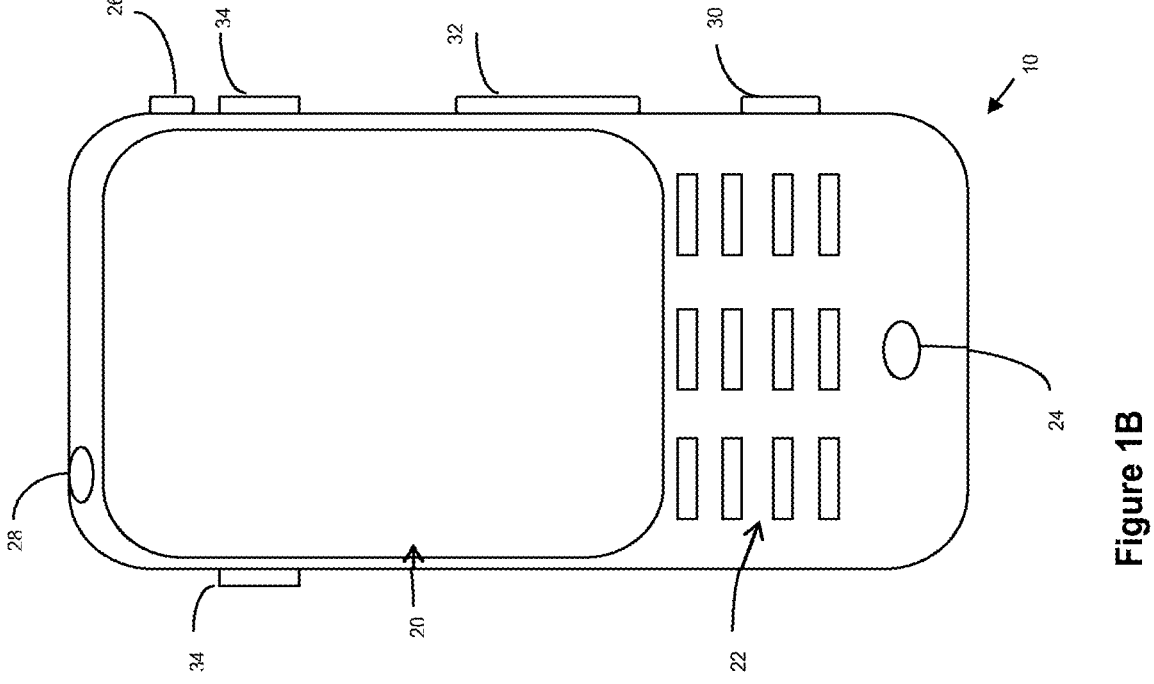

FIG. 1B illustrates further detail of an exemplary electronic device, the UE 10, in both plan view (left) and sectional view (right), and example embodiments of the invention may be performed using one or some combination of those more function-specific components. At FIG. 1B the UE 10 has a graphical display interface 20 and a user interface 22 illustrated as a keypad but understood as also capable of encompassing touch-screen technology as with the graphical display interface 20, and voice-recognition technology as received at the microphone 24. A power actuator 26 controls the device being turned on and off by the user.

The exemplary UE 10 may have a camera 28 controlled by a shutter actuator 30 and optionally by a zoom actuator 32 which may alternatively function as a volume adjustment for the speaker(s) 34 when the camera 28 is not in an active mode. There may also be an image/video processor 44 and/or a separate audio processor 46. The graphical display interface 20 is refreshed from a frame memory 48 as controlled by a user interface chip 50 which may process signals to and from the display interface 20 and/or additionally process user inputs from the keypad 22 and elsewhere.

Within the sectional view of FIG. 1B are seen multiple transmit/receive antennas 36 that are typically used for cellular communication. The antennas 36 may be multi-band for use with other radios in the UE. The power chip 38 controls power amplification on the channels being transmitted and/or across the antennas that transmit simultaneously where spatial diversity is used, and amplifies the received signals. The power chip 38 outputs the amplified received signal to the radio-frequency (RF) chip 40 which demodulates and down converts the signal for baseband processing. The baseband (BB) chip 42 detects the signal which is then converted to a bit-stream and finally decoded. Similar processing occurs in reverse for signals generated in the UE 10 and transmitted from it.

Throughout the apparatus are various memories such as random access memory RANI 43, read only memory ROM 45, and in some embodiments there can be removable memory such as the illustrated memory card 47. One or more of these memories 43, 45 and 47 can incorporate the memory 10B in which the various programs 10C are stored.

Also within the UE 10 there are components including a GPS/A-GPS sensor function 37 (assisted GPS and/or GPS) 37 whose operations are detailed below in a non-limiting embodiment of the invention. In addition, the UE 10 includes a context inference function 10E whose operations are also detailed below in a non-limiting embodiment of the invention. All of these components within the UE 10 are normally powered by a portable power supply such as a galvanic battery 49.

The processors 38, 40, 42, 44, 46, 50, if embodied as separate entities in a UE 10 or eNB 12, may operate in a slave relationship to the main processor 10A, 12A, which may then be in a master relationship to them. Other embodiments may combine some of the functions described above for FIG. 1B in fewer processors and/or memories. Any or all of these various processors of FIG. 1B access one or more of the various memories, which may be on-chip with the processor or separate therefrom.

Note that the various chips or processors (e.g., 10A, 12A, 14A, 15A, 38, 39, 40, 42, etc.) that were described above may be combined into a fewer number than described and, in a most compact case, may all be embodied physically within a single chip. Further, any one or more of these chips or processors may include signaling information in accordance with an air interface standard of an applicable cellular system, and/or any number of different wired or wireless networking techniques, including but not limited to short range wireless networking techniques, such as Wireless-Fidelity (Wi-Fi), wireless local access network (WLAN) techniques such as Institute of Electrical and Electronics Engineers (IEEE) 802.11, 802.16, near field communication (NFC), and/or the like. In addition, these signals may include speech data, user generated data, user requested data, and/or the like. In this regard, the UE 10 may be capable of operating with one or more air interface standards, communication protocols, modulation types, access types, and/or the like. For example, the TIE 10 may be capable of operating in accordance with various first generation (1G), second generation (2G), 2.5G, third-generation (3G) communication protocols, fourth-generation (4G) communication protocols, Internet Protocol Multimedia Subsystem (IMS) communication protocols (e.g., session initiation protocol (SIP)), and/or the like. For example, the UE 10 may be capable of operating in accordance with 2G wireless communication protocols IS-136 (Time Division Multiple Access (TDMA)), Global System for Mobile communications (GSM), IS-95 (Code Division Multiple Access (CDMA)), and/or the like. Also, for example, the UE 10 may be capable of operating in accordance with 2.5G wireless communication protocols General Packet Radio Service (GPRS), Enhanced Data GSM Environment (EDGE), and/or the like. Further, for example, the UE 10 may be capable of operating in accordance with 3G wireless communication protocols such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The UE 10 may be additionally capable of operating in accordance with 3.9G wireless communication protocols such as Long Term Evolution (LTE) or Evolved Universal Terrestrial Radio Access Network (E-UTRAN) and/or the like. Additionally, for example, the UE 10 may be capable of operating in accordance with fourth-generation (4G) wireless communication protocols and/or the like as well as similar wireless communication protocols that may be developed in the future.

Some Narrow-band Advanced Mobile Phone System (VAMPS), as well as Total Access Communication System (TACS), mobile terminals, such as the UE 10, may also benefit from embodiments of this invention, as should dual or higher mode phones (e.g., digital/analog or TDMA/CDMA/analog phones). Additionally, the UE 10 10 may be capable of operating according to Wireless Fidelity or Worldwide Interoperability for Microwave Access (WiMAX) protocols.

Figure 2A:
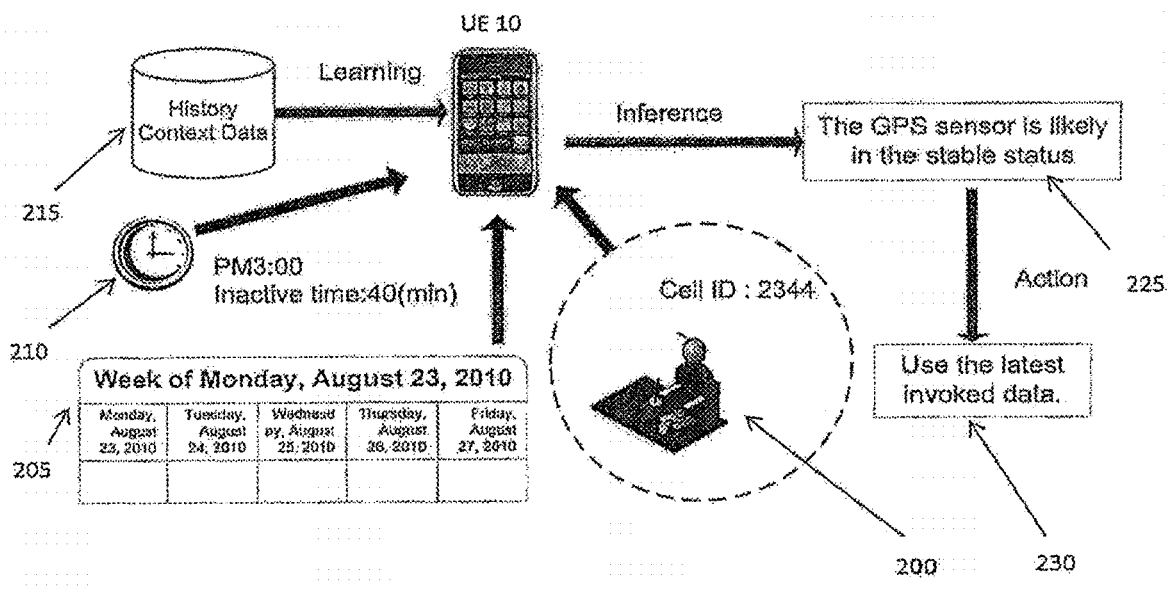
FIGS. 2A and 2B illustrate operations and devices associated with context learning and sensing in accordance with the exemplary embodiments of the invention.

With regards to FIG. 2A there is illustrated a context sensing operation by a user device (UE 10), in this case UE 10 is a smart phone, by one example embodiment of the invention. However, in accordance with the exemplary embodiments, the invention may be practiced to the advantage of any electronic device with communication capabilities. Sensors of the UE 10 can sense any data and perform analysis of the context data. The sensing can occur at a predetermined or other times herein referred to as sampling times. The sampling times are configurable by the user 200 with the UE 10 and/or by an application provider and/or by a manufacturer. Each sampling time may represent a window of time, such as a sampling period having a beginning moment in time and an ending moment in time. Further, a sensor of the UE 10 can be determined by the UE 10 to be either active or inactive at a particular sampling time. If a sensor is determined "Active" at a sampling time, then the sensor may be invoked by the UE 10. If the sensor is determined to be "Inactive" at the sampling time then the sensor is not invoked.

It is noted that sensors may include sensors providing cellular service information (e.g., cell ID, global system for mobile communication (GSM) information). Further, any other information or data that is available in the UE 10, such as date/time information, system/activity information, calendar/appointment information, mood information, presence information (away, available, busy, etc.), other devices or users in proximity, and/or the like or any combination thereof can be considered as part of context data. Invoked sensors may comprise sensors consuming a relatively large amount of power and/or that are required only for operation of context-aware applications. By way of illustrative example and not by way of limitation, active sensors may include sensors providing positioning (e.g., GPS/A-GPS) information, audio information, light sensors, 3-D sensors, motion sensors, accelerometers, speed sensors, compass, altitude, pressure, web service sensors, wireless sensors, wireless local area network (WLAN) detection sensors, and/or the like.

In one example embodiment of the invention as illustrated in FIG. 2A, a user 200 associated with a cell ID 2344 of a network, such as a cellular network, is operating the UE 10. There is a determination, such as based on a particular day of the week 205 and/or a time of day 210 and/or an inactivity period 210, that a context update may be needed for the device. Thus, a context data sampling time is initiated in which the UE 10 can be configured to collect context information captured from outputs of its sensors or otherwise captured from available as historical context data stored on a memory 215. The UE 10 will then use the collected context information to generate and/or update a current context model. It is noted that the memory 215 may be incorporated in the memory 10B of the UE 10 or a memory external to the UE 10.

Further, it can be determined that current context data/model may be stable (e.g., a location of the device is unchanged). Therefore, a sensor such as the GPS/A-GPS sensor function 37 can remain in a stable status, as indicated in block 225 of FIG. 2A. In this case the UE 10 will use the last context data invoked, as indicated in block 230 of FIG. 2A, for the current context model. The last context data invoked with sensor context data captured at least in part by the GPS/A-GPS sensor function 37 being stable, for example.

Figure 2B:
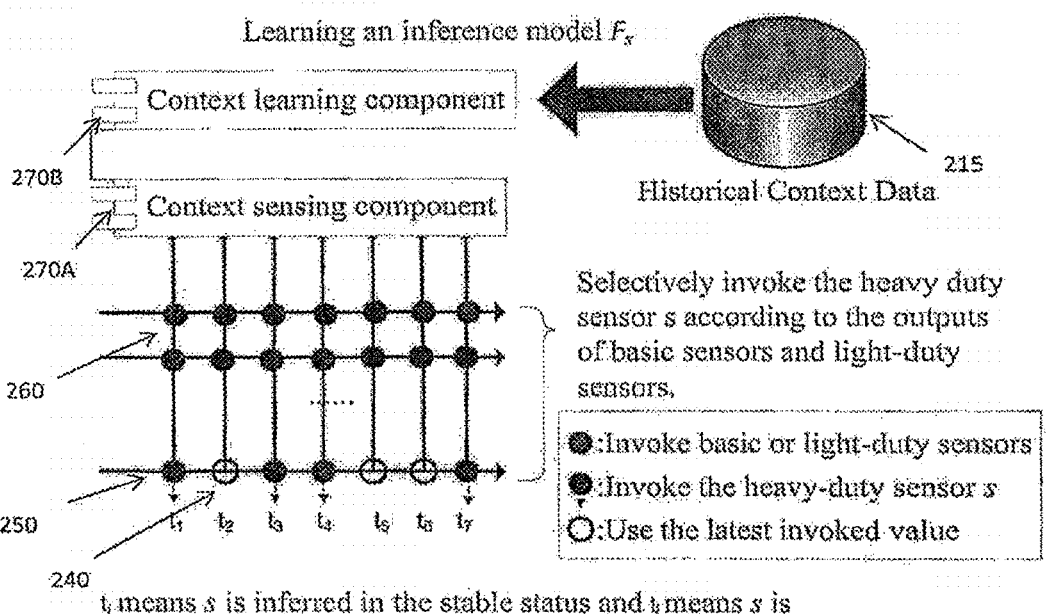

In FIG. 2B there is illustrated a more detailed view with regards to the UE 10 invoking sensor types to learn an inference model ($F_s$). Sampling times $t_1$-$t_7$ are identified as 240. As can be seen, at the sampling times $t_1$, $t_3$, $t_4$ and $t_7$ both the basic and/or light duty sensors and the heavy duty sensors of the sensors 260 are invoked per 250, thus both these types of sensors are "Active". Whereas, at sampling times $t_2$, $t_5$ and $t_6$ the last or latest invoked value is still current and only the basic and/or light duty sensors are invoked per 250. In this case heavy duty sensors are "Inactive" while the basic and/or light duty sensors are "Active", since the context sensing inference model has made a prediction that it is likely the heavy duty sensors can at the most make a marginal information contribution. Basic characteristics of these sensors can be described as:

Basic Sensor: basic sensors operate continuously to support basic functions of mobile devices. Basic sensors include Cell ID sensors and time sensors (e.g., clock time);

Light-duty Sensor: light-duty sensors use less energy consumption; and

Heavy-duty Sensor: heavy-duty sensors consume a relatively high amount of energy. The heavy-duty sensors are not necessary for providing the basic functions of mobile devices, such as the GPS/A-GPS sensor function 37.

In addition, with regards to FIG. 2B the context learning and sensing components 270A and 270B, respectively, are coupled to outputs of the context sensors and the historical context data 215, the coupling can be used to process context data and determine whether to invoke the sensor(s) and whether to build a current context model.

As stated above, the exemplary embodiments of the invention provide at least a method wherein the context server 15 is enabled to perform crowd souring of context models. Contexts models of different devices can be uploaded or otherwise provided to the server to be stored in a common repository, such as the memory 215. It is noted that the memory 215 can include the memory 12B, 14B and/or 15B and/or be an external memory or database associated with the server and/or the network devices. Further, the operations of the context server 15 can be performed by the server 12E and/or the server 14E. In accordance with the exemplary embodiments, the server can analyze the uploaded or otherwise obtained context models and/or context data in order to enable new user devices and/or existing user devices to communicate with the server 15 so as to most efficiently obtain current context models optimum for the device.

In accordance with the exemplary embodiments of the invention, as stated above, the server 15 is enabled to:

receive and store one or more context models from one or more user devices receive request with an initial context model (i.e. insufficient or outdated context model) from an another/new user device for an initial context inference model identify the one or more context models which can be used by/for the another/new user device due to full or partial similarities between the one more context models and the initial context model combine and/or infer the one or more identified context models for the another/new user device as the initial context inference model; download/share with the another/new user device the initial context inference model prompt/instruct the another/new user device to adapt the downloaded/shared initial context inference model and/or converge to an optimized context inference model for the another/new user device while the device is being used.

In addition, in accordance with the exemplary embodiments of the invention, to identify one or more context models which can be optimum for a device the context inference server 15 can use historical context information including information related to any established correlations between output(s) of an invoked sensor and/or other available context information. In addition, context inference server 15 can process and use such information as can obtained from one or more active sensors and/or from one or more other invoked sensors of one or more user equipment.

Further, context inference server 15 can obtain historical context information and/or information such as from the GPS/A-GPS sensor function 37 of the UE 10. This information may be used to derive the user 200 location(s) and/or direction(s) of travel. Then a determination can be made as to determine whether the location of the user 200 has changed during the week 205. Accordingly, such information and correlations may be used by the UE 10 to allow for a determination of whether a context model received by the UE 10 is based on accurate (e.g., uncorrupted) context information.

In addition, it is noted that in accordance with the exemplary embodiments of the invention, information used for the context inference operations performed by the server 15 and/or the UE 10 can be any type of sensor data or context data. In addition, historical context information associated with any of the UE 10 and/or the server 15, or any electronic device in accordance with the embodiments of the invention can be based on any kind of data obtained from any type of device and/or sensor, and is not limited to be obtained from a user device such as the UE 10 and/or the server 15. Furthermore, any reference to a wireless communication network in this description is non-limiting. The exemplary embodiments of the invention can be performed to the advantage of any device(s) in a hard wired and/or wireless communication network, or in a network with a combination of both wired and wireless communication capabilities. Further, this includes multiple wired and/or wireless networks which are coupled together in some fashion, either directly or indirectly.

As will be appreciated, trends in evolution of context may change over time, such as when a user of user equipment, such as the UE 10, changes jobs, moves to a new location, or the like. Further, accuracy of a determined probability of change in output of a sensor can be enhanced when context modeling determinations use historical context information in addition to context data obtained from sensors of the UE 10. In this regard, context inference server 15 may collect context information captured by the UE 10 and use the captured context information in addition to historical data to identify one or more context models optimum for the UE 10. The UE 10 can then obtain the optimum context models from the server 15 and update its current context model accordingly. Such updating may be performed in accordance with any defined criteria, such as periodically, in response to an occurrence of a predefined event, and/or the like.

Further, in accordance with the exemplary embodiments of the invention, the context inference function 39 can access the crowd context inference server 15 such as to initiate the process, in accordance with the exemplary embodiments, either directly and/or by accessing historical data stored in the memory 215. In accordance with an exemplary embodiment of the invention, the context inference function 39 of the UE 10 can communicate with the server 15 and/or the historical database in order to initiate a determination of whether a current context model of the UE 10 is different from another context model determined by the server 15 to be optimum for the UE 10. In this regard, the UE 10 can determine whether to utilize the context model available from the server 15 and/or utilize context data input to the context inference function 39. As discussed above, observed context information may include context information obtained from one or more active sensors of the UE 10. Additionally or alternatively, observed context information may include recent observed context information from an invoked sensor. For example, recently observed context information that was captured within a predefined period of time from an active sensor. Therefore, the observed context information can be deemed as current and/or within an acceptable degree of accuracy to be accepted as an input to the context inference function 39 based on the observation time and/or degree of accuracy meeting configurable thresholds of sensor control circuitry of the UE 10.

Figure 3:
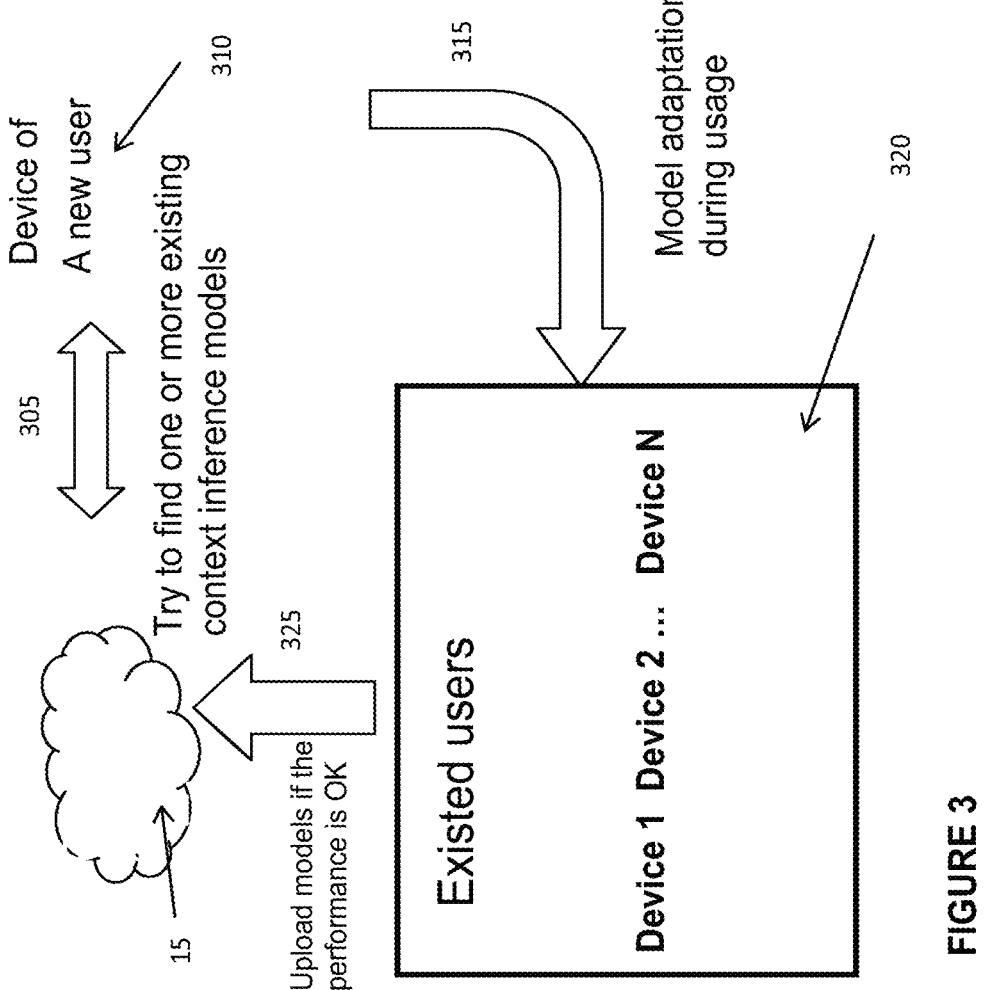
FIG. 3 illustrates an operational flow of a context model inference system in accordance with the exemplary embodiments of the invention.

FIG. 3 illustrates the operation of the server 15 in accordance with the exemplary embodiments of the invention. In FIG. 3 a crowd context inference server 15 is incorporated in a network, as represented by a cloud in FIG. 3. For example, the network cloud can be the wireless network 1 as illustrated in FIG. 1A. Further, the crowd context inference server 330 can be any of servers 12E, 14E and/or 15 of the wireless network 1. In FIG. 3, a new user 310 becomes associated with a device of the network cloud. Then for a predetermined period, or other period, context data will be collected from the new user 310 and communicated to the crowd context inference server 15.

In accordance with a non-limiting embodiment of the invention, the context data from the new user 310 can include spatial and trajectory data of the new user 310 and/or additional context data observed from the context sensors of the new user 310. The context sensors of the new user 310 including heavy-duty, basic, and/or light-duty sensors, as described above. The server 15 will then identify context models from a plurality of context models associated with one or more existing users (K) 320. These context models previously uploaded to the server 15 by the users K and stored by the server in a data repository associated with the server. The server 15 identifies the context models which are similar and/or most compatible based on the context data received from the new user 310. The server 15 then validates the identified context inference models using the collected context data from the new user. Validating includes determining, by the server, whether a stored context model will be optimum for the new user 310. To be optimum, requirements to incorporate and operate the context model (e.g., energy, processing, and/or memory requirements, etc.) in the UE 10 must be minimal. It is noted that the context models which have been successfully validated can be combined to create a single context model for the new user 310. Then a validated or combined initial context model which is optimum for the new user 310 can be provided to the new user 310 for adaptation and usage by the new user 310.

In accordance with an exemplary embodiment of the invention, the server 15 is enabled to selectively collect context models from different UEs at predetermined and/or configured and/or threshold initiated intervals. The predetermined and/or configured intervals can be configured by an administrator and/or manufacturer of the server 15 context apparatus. Further, in accordance with the exemplary embodiments, the server 15 is enables to adapt a collected context model, to modify and update a context model of a UE such as to change a behavior of the UE, and/or to examine the collected context model to verify the model performance. In accordance with the exemplary embodiments, any of these novel operations can be used to the benefit of a UE at least to optimize the context model for the UE without causing the UE to expend its own resources.

In addition, in accordance with the exemplary embodiments of the invention, the initial model and/or other context model can be adapted, by the server 15 and/or the new user 310, to address any inconsistencies which are identified. Such inconsistencies can be related to errors in data interpretation and calculations/determining as well as changes in context data output from sensors at the new user 310. In accordance with the exemplary embodiments, the new user device can be configured to make corrections to the context model and/or address data interpretation discrepancies as inferred from an output of a context sensor. It is noted that at various nodes or checkpoints between the new user 310 and the server 330 context data inferred by an output of a context sensor can be changed and/or corrupted so as to be different from the real output.

Further, in accordance with the exemplary embodiments, the server 15 can collect one or more context models in order to build a context model and/or a composite context model for use by the server 15 to predict a context model performance for a particular UE. This collecting can be performed, for example, during a cold start or adaptation period of a new UE and/or anytime for any UE. The server 15 can analyze a collected context model to determine a level of performance of the model for a UE, such as determine whether or not a context model would improve a UE performance. The exemplary embodiments of the invention enable the server 15 to verify a context model performance using predicted and/or real values associated with context sensor(s) of a new UE and/or a U already associated with a wireless communication network. The server 15 can determine whether a performance deviation and/or sensor interpretation error and/or context model analysis result exceeds a threshold setting and/or manually configured setting. Further, the server 15 can reconfigure and tune the context model using an adaptation algorithm to adjust context model parameters, such as to minimize deviations and/or errors as at least mentioned above.

FIG. 6 illustrates a block diagram identifying some of the operations enable to be performed by one or more apparatus in accordance with the exemplary embodiments of the invention. As in block 610 of FIG. 6 a service or an apparatus, for example the crowd context inference server 15, is enabled to receive a request with an initial context model (i.e. insufficient or outdated context model) from another/new user device, for example the UE 10, an initial context inference model. As indicated in block 620, the apparatus is enabled to identify one or more context models which can be used by/for the another/new user device due to full or partial similarities between the one more context models and the initial context model. As per block 630, the apparatus is enabled to combine, adapt and/or infer the one or more identified context models for the another/new user device as the initial context inference model. As in block 640 the apparatus is enabled to provide/share with the another/new user device the initial context inference model. Further, as in block 660 the apparatus is optionally enabled to prompt/instruct the another/new user device to adapt the downloaded/shared initial context inference model as a current context model. Further, the another/new user device is enabled to converge and/or adapt the initial context inference model and the initial context model to an optimized context model for the another/new user device while the device is being used. Based on the initial context inference model or optimized context model the another/new user device is enabled to fast and easy adjust and/or adapt one or more its profiles functions, applications, features and/or embedded devices, for example the one or more sensors, in its current and future contexts without any long adaptation or learning process/curve.

In addition, in accordance with the exemplary embodiments of the invention, a threshold, such as a performance threshold, can be set at the new user 310 (or the UE 10). The threshold can be used such that if performance associated with a current context model of the device reaches a performance threshold level, the device will automatically upload its current context model to the server 15. Further, in accordance with the exemplary embodiments of the invention, a current context model can be uploaded manually and or periodically to the crowd context inference server 15. The setting with regards to the threshold(s) and the scheduling of uploads can be configured by the user of the device, the server 15, the operator of the network, and/or the manufacturer of the device. In addition, in accordance with the exemplary embodiments, samples of users' spatial and temporary trajectories can also be uploaded automatically and/or periodically to the crowd context inference server 15 to identify the user.

FIG. 4 and FIG. 5 are block diagrams which each illustrate a method in accordance with the exemplary embodiments of the invention. All the methods according to the exemplary embodiments may be performed by an apparatus using at least one processor to execute at least one computer program embodied or stored on at least one computer readable memory of the apparatus.

With regards to FIG. 4, at block 410 there is receiving context data, for example the initial context model, from an electronic device, for example the UE 10. At block 420 there is a causing, at least in part based on the received context data, an identification of at least one context model, for example the initial context inference model, compatible with the electronic device. Then at block 430 there is causing, at least in part, provision of the electronic device with the at least one compatible context model.

In accordance with the exemplary embodiments as described in the paragraph above, wherein the context data comprises data associated with at least one of a location and direction of movement of the electronic device.

Further, in accordance with the exemplary embodiments described in the paragraphs above, the identification comprises using the received context data of the device to identify the at least one compatible context models from a plurality of context models of other devices.

In accordance with the exemplary embodiments as described in the paragraphs above, the identification further comprises causing, at least in part, comparison of at least one of a location and direction of movement of the other devices to the at least one of the location and the direction of movement of the electronic device.

In accordance with the exemplary embodiments as described in the paragraphs above, the identification is in response to the electronic device being associated with a network service.

In accordance with the exemplary embodiments as described in the paragraph above, wherein there are at least two compatible context models and further comprising, combining the at least two context models to create an initial context model, wherein the initial context model is provisioned to the electronic device.

In accordance with the exemplary embodiments as described in the paragraph above, the provisioning prompts the electronic device to adapt the provided context model.

Further, in accordance with the exemplary embodiments of the invention, as illustrated in FIG. 4, there is an apparatus comprising at least one processor, and at least one memory including computer program code, where the at least one memory and the computer program code are configured, with the at least one processor, to cause the apparatus to at least receive context data from an electronic device, cause, at least in part based on the received context data, identification of at least one context model compatible with the electronic device, and cause, at least in part, provision of the electronic device with the at least one compatible context model.

The apparatus according to the paragraph above, where the received context data comprises data associated with at least one of a location and direction of movement of the electronic device.

The apparatus according to the paragraphs above, where the identification includes using the received context data of the device to identify the at least one compatible context model from a plurality of context models associated with other devices.

In accordance with the exemplary embodiments of the invention as described in the paragraphs above, the identification further comprises the at least one memory including the computer program code is configured, with the at least one processor to cause, at least in part, the apparatus to compare at least one of a location and direction of movement of the other devices to the at least one of the location and the direction of movement of the electronic device.

The apparatus according to the paragraph above where the identification is in response to the electronic device being associated with a network service.

In accordance with the exemplary embodiments of the invention as described in the paragraph above, where there are at least two compatible context models and further comprising, the at least one memory including the computer program code is configured, with the at least one processor to cause the apparatus to combine the at least two context models to create an initial context model, wherein the initial context model is provisioned to the electronic device.

The exemplary apparatus according the paragraphs above where the provisioning causes or prompts the electronic device to adapt the provided context model.

With regards to FIG. 5, at block 510 there is causing, at least in part, a provision of context data associated with an electronic device, for example the UE 10, to a context inference service, for example the crowd context inference server 15. At block 520 there is, in response, receiving a context model, for example the initial context inference model, from the context inference service. Then at block 530 there is causing adaptation of the received context model as a current context model of the electronic device.

In accordance with the exemplary embodiments as described in the paragraph above, the received context model is an initial context model.

In accordance with the exemplary embodiments as described in the paragraph above, the initial context model comprises a combination of more than one context model compatible with the portable electronic device.

Further, in accordance with the exemplary embodiments as described in the paragraph above, there is causing the adaptation of the received context is based on instructions received by the electronic device from the context inference service.

In accordance with the exemplary embodiments as described in the paragraphs above, the causing the provision of the context data is in response to the electronic device being newly associated with a network service.

In addition, in accordance with the exemplary embodiments of the invention, as illustrated in FIG. 5, there is an apparatus comprising at least one processor, and at least one memory including computer program code, where the at least one memory and the computer program code are configured, with the at least one processor, to cause the apparatus to at least cause, at least in part, a provision of context data associated with an electronic device to a context inference service. Then in response, receive a context model from the context inference service and cause, at least in part, adaptation of the received context model as a current context model of the electronic device.

In accordance with the exemplary embodiments as described in the paragraph above, the received context model is an initial context model.

Further, in accordance with the exemplary embodiments as described in the paragraph above, the initial context model comprises a combination of more than one context model compatible with the portable electronic device.

In accordance with the exemplary embodiments as described in the paragraph above, there is causing the adaptation of the received context is based on instructions received by the electronic device from the context inference service.

In addition, in accordance with the exemplary embodiments as described in the paragraph above, the causing the provision of the context data is in response to the electronic device being newly associated with a communication network.

Further, it is noted that an order illustrated in the steps and/or blocks of FIGS. 4, 5 and 6 are non-limiting. In accordance with the exemplary embodiments of the invention any of these steps and/or blocks may be omitted. Further in accordance with the exemplary embodiments any of these blocks and/or steps may be performed in a different order that which may appear illustrated.

The foregoing description has provided by way of exemplary and non-limiting examples a full and informative description of embodiments of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention. The example embodiments of the invention are not limited in their separate embodiments but may be combined in any manner to provide various additional embodiments of the invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the embodiments of this invention could be used to advantage without the corresponding use of other features. As such, the foregoing description should be considered as merely illustrative of the principles of the invention, and not in limitation thereof.

What is claimed is:

1. A method comprising:
   receiving, by a server and from a user equipment, a request for a second context model, the request including an identification of a first context model associated with the user equipment;
   identifying, by the server, one or more context inference models compatible with the user equipment, the compatibility based on similarities between each of the one or more context inference models and the first context model;
   combining, by the server, the one or more context inference models to create the second context model for the user equipment; and
   providing, by the server and to the user equipment, the second context model.

2. The method of claim 1, further comprising:
   receiving, by the server and from one or more other user devices, the one or more context inference models.

3. The method of claim 1, wherein the request for the second context model comprises an indicator that the first context model is at least one of insufficient and outdated.

4. The method of claim 1, wherein the request for the second context model is received with context data provided by the user equipment, wherein the identifying of the one or more context inference models is based at least partially on the context data.

5. The method of claim 4, wherein the identifying of the one or more context inference models is based at least partially on historical context information.

6. The method of claim 1, wherein the second context model is provided to the user equipment with instructions to adapt the second context model.

7. The method of claim 1, wherein the one or more context inference models are validated for the user equipment, the validation based on context data collected from the user equipment.

8. An apparatus comprising, at least one processor; and at least one memory including computer program code, where the at least one memory and the computer program code are configured, with the at least one processor, to cause the apparatus to at least:

receive, from a user equipment, a request for a second context model, the request including an identification of a first context model associated with the user equipment;

identify one or more context inference models compatible with the user equipment, the compatibility based on similarities between each of the one or more context inference models and the first context model;

combine the one or more context inference models to create the second context model for the user equipment; and provide, to the user equipment, the second context model.

9. The apparatus of claim 8, wherein the apparatus is further caused to at least:

receive, from one or more other user devices, the one or more context inference models.

10. The apparatus of claim 8, wherein the request for the second context model comprises an indicator that the first context model is at least one of insufficient and outdated.

11. The apparatus of claim 8, wherein the request for the second context model is received with context data provided by the user equipment, wherein the one or more context inference models is identified based at least partially on the context data.

12. The apparatus of claim 11, wherein the one or more context inference models is identified based at least partially on historical context information.

13. The apparatus of claim 8, wherein the second context model is provided to the user equipment with instructions to adapt the second context model.

14. The apparatus of claim 8, wherein the one or more context inference models are validated for the user equipment, the validation based on context data collected from the user equipment.

15. A non-transitory computer readable storage medium including program code which when executed by at least one processor causes operations comprising:

receiving, from a user equipment, a request for a second context model, the request including an identification of a first context model associated with the user equipment;

identifying one or more context inference models compatible with the user equipment, the compatibility based on similarities between each of the one or more context inference models and the first context model;

combining the one or more context inference models to create the second context model for the user equipment; and providing, to the user equipment, the second context model.

\* \* \* \* \*